(12) United States Patent
Tamura et al.

(10) Patent No.: US 8,947,169 B2
(45) Date of Patent: Feb. 3, 2015

(54) OSCILLATING DEVICE AND ELECTRONIC APPARATUS

(71) Applicant: Seiko Epson Corporation, Tokyo (JP)

(72) Inventors: Tomohiro Tamura, Suwa (JP); Yoshiyuki Maki, Suwa (JP); Noriaki Tanaka, Atsugi (JP)

(73) Assignee: Seiko Epson Corporation (JP)

(*) Notice: Subject to any disclaimer, the term of this patent is extended or adjusted under 35 U.S.C. 154(b) by 80 days.

(21) Appl. No.: 13/874,683

(22) Filed: May 1, 2013

(65) Prior Publication Data
US 2013/0300510 A1 Nov. 14, 2013

(30) Foreign Application Priority Data

May 9, 2012 (JP) ................................ 2012-107792

(51) Int. Cl.
H03B 1/00 (2006.01)
H03L 1/02 (2006.01)
G04G 3/04 (2006.01)
H03L 1/04 (2006.01)
H03L 7/099 (2006.01)

(52) U.S. Cl.
CPC .. *H03L 1/02* (2013.01); *G04G 3/04* (2013.01); *H03L 1/04* (2013.01); *H03L 7/099* (2013.01)
USPC ............... 331/69; 331/47; 331/94.1; 331/176

(58) Field of Classification Search
USPC ......................... 331/2, 46–48, 66, 68–70, 176
See application file for complete search history.

(56) References Cited

U.S. PATENT DOCUMENTS

| 4,899,117 | A | * | 2/1990 | Vig ..................................... 331/3 |
| 6,172,570 | B1 | * | 1/2001 | Deng .................................. 331/3 |
| 6,710,663 | B1 | * | 3/2004 | Berquist ............................ 331/3 |
| 7,391,273 | B2 | * | 6/2008 | Seki et al. ......................... 331/47 |
| 2005/0062552 | A1 | * | 3/2005 | Deng et al. .................... 331/94.1 |
| 2005/0068115 | A1 | * | 3/2005 | Atsumi et al. ............... 331/94.1 |
| 2010/0052801 | A1 | * | 3/2010 | Koyama et al. ................. 331/69 |

FOREIGN PATENT DOCUMENTS

| JP | 63-173419 | 7/1988 |
| JP | 02-011023 | 1/1990 |
| JP | 2006314047 A | 11/2006 |
| JP | 2009222544 A | 10/2009 |
| WO | WO-2006090831 A1 | 8/2006 |

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

An oscillating device includes an atomic oscillator, an oven controlled crystal oscillator, a correcting unit configured to correct an output signal of the oven controlled crystal oscillator on the basis of an output signal of the atomic oscillator, a housing configured to house the atomic oscillator and the oven controlled crystal oscillator, and a temperature adjusting unit configured to adjust the temperature in the housing to a predetermined temperature.

9 Claims, 6 Drawing Sheets

OSCILLATING DEVICE AND ELECTRONIC APPARATUS

BACKGROUND

1. Technical Field

The present invention relates to an oscillating device and an electronic apparatus.

2. Related Art

There has been known an atomic oscillator that oscillates on the basis of an energy transition of atoms of alkali metal such as rubidium or cesium.

In general, such an atomic oscillator has a highly accurate oscillation characteristic for a longterm. However, a short-term oscillation characteristic is inferior to that of a crystal oscillator.

Therefore, as an oscillating device including such an atomic oscillator, there has been known an oscillating device including an atomic oscillator and an oven controlled crystal oscillator (OCXO). The oscillating device corrects an output signal of the oven controlled crystal oscillator on the basis of an output signal of the atomic oscillator (see, for example, JP-A-2006-314047).

In recent years, in such an oscillating device, it is demanded to further improve the accuracy of the oscillation characteristic while realizing a reduction in size and simplification.

SUMMARY

An advantage of some aspects of the invention is to provide an oscillating device that can exhibit an excellent oscillation characteristic for a long term and realize a reduction in size and simplification and an electronic apparatus including the oscillating device.

The invention can be implemented as the following forms or application examples.

Application Example 1

This application example is directed to an oscillating device including: an atomic oscillator; an oven controlled oscillator; a correcting unit configured to correct an output signal of the oven controlled oscillator on the basis of an output signal of the atomic oscillator; a housing configured to house the atomic oscillator and the oven controlled oscillator; and a temperature adjusting unit configured to adjust the temperature in the housing to a predetermined temperature.

With the oscillating device configured in this way, it is possible to subject the atomic oscillator and the oven controlled oscillator to temperature adjustment with the common temperature adjusting unit. As a result, it is possible to realize a reduction in size and simplification of the oscillating device. It is possible to prevent or reduce the influence of an external temperature change on the atomic oscillator and the oven controlled oscillator and improve oscillation characteristics of the atomic oscillator and the oven controlled oscillator.

It is possible to exhibit an excellent oscillation characteristic for a long term by correcting an output of the oven control oscillator on the basis of an output signal of the atomic oscillator.

Application Example 2

In the oscillating device in the application example 1, it is preferable that the temperature adjusting unit includes a temperature adjusting element configured to heat or cool the housing.

Consequently, it is possible to maintain the temperature in the housing in a proper temperature range even if the external temperature changes.

Application Example 3

In the oscillating device in the application example 1, it is preferable that the housing includes a first housing and a second housing configured to house the first housing.

Consequently, a space between an inner layer and an outer layer of the housing forms a heat insulating layer. Therefore, it is possible to reduce the influence of an external temperature change on the inside of the housing.

Application Example 4

In the oscillating device in the application example 1, it is preferable that the temperature adjusting element is provided between the first housing and the second housing.

Consequently, it is possible to uniformly adjust the temperature in the housing with a relatively simple configuration.

Application Example 5

In the oscillating device in the application example 3, it is preferable that the temperature adjusting unit includes a temperature control circuit configured to control the temperature adjusting element, and the temperature control circuit is provided between the first housing and the second housing.

Consequently, it is possible to more effectively reduce the influence of the external temperature change on the inside of the housing.

Application Example 6

It is preferable that the oscillating device in the application example 1 includes a heat insulating layer configured to cover the atomic oscillator and the oven controlled oscillator.

Consequently, it is possible to reduce the influence of the external temperature change on the inside of the housing.

Application Example 7

In the oscillating device in the application example 6, it is preferable that the heat insulating layer is formed by a decompressed space.

Consequently, it is possible more to efficiently reduce the influence of the external temperature change on the inside of the housing.

Application Example 8

In the oscillating device in the application example 1, it is preferable that the atomic oscillator includes a gas cell in which gaseous atoms are encapsulated, a light emitting unit configured to emit excitation light for exciting the atoms, and a light detecting unit configured to detect the excitation light transmitted through the gas cell and is configured to oscillate making use of a quantum interference effect. It is preferable that the oven controlled oscillator includes a crystal resonator and is configured to adjust the temperature of the crystal resonator to a predetermined temperature.

Consequently, it is possible to exhibit an excellent oscillation characteristic for a long term making the most of both advantages of an oscillation characteristic of the atomic oscillator excellent for a long term and an oscillation characteristic of the oven controlled oscillator excellent for a short term.

The atomic oscillator that makes use of the quantum interference effect can be reduced in size compared with an atomic oscillator that makes use of a double resonance phenomenon. Therefore, it is possible to realize a reduction in size of the oscillating device.

Application Example 9

This application example is directed to an electronic apparatus including the oscillating device in the application example 1.

Consequently, it is possible to provide the electronic apparatus having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of an oscillating device and an electronic apparatus the invention are explained in detail below with reference to the accompanying drawings.

First Embodiment

Figure 1:
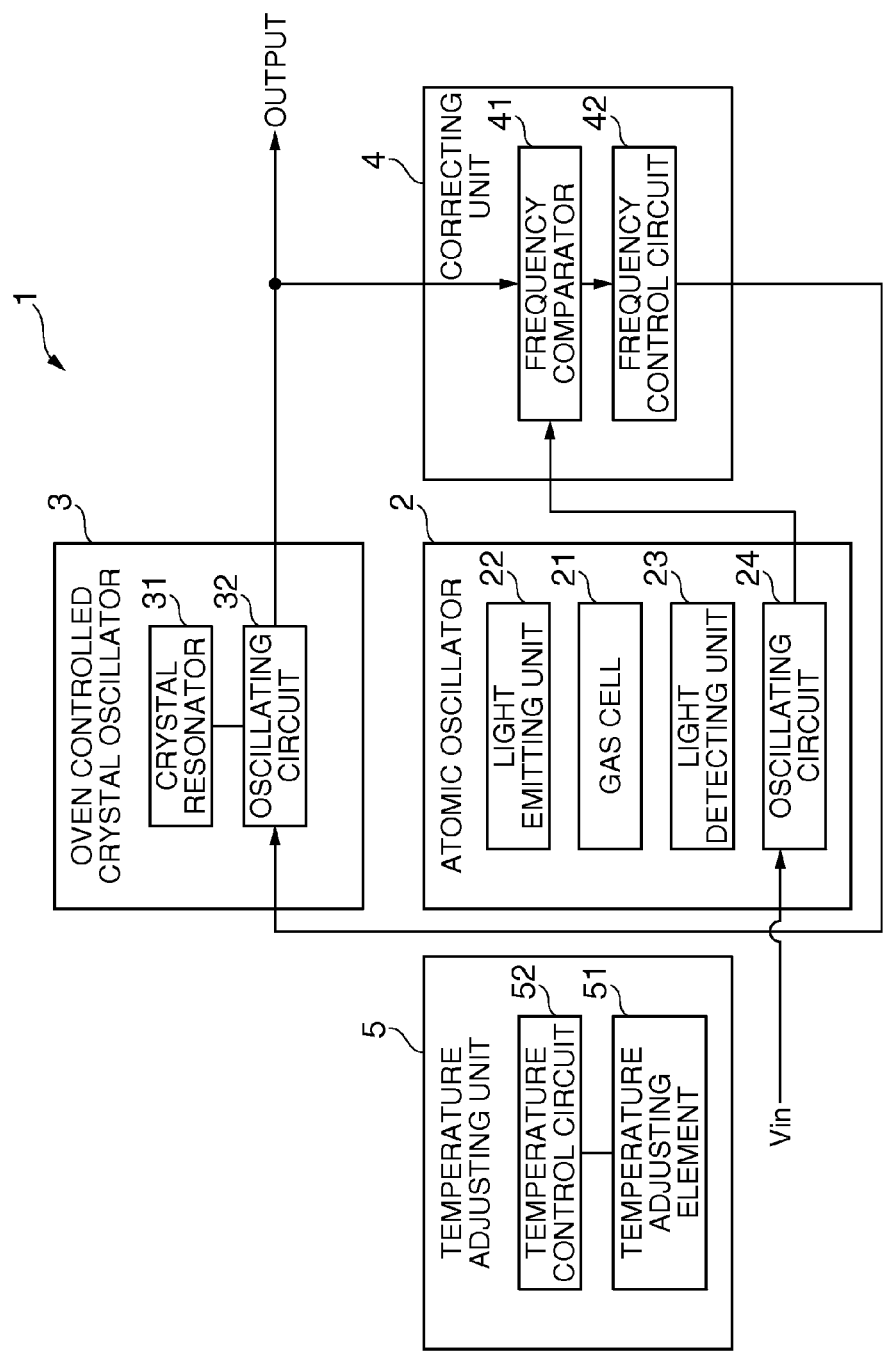
FIG. 1 is a block diagram showing a schematic configuration of an oscillating device according to a first embodiment of the invention.
Figure 2:
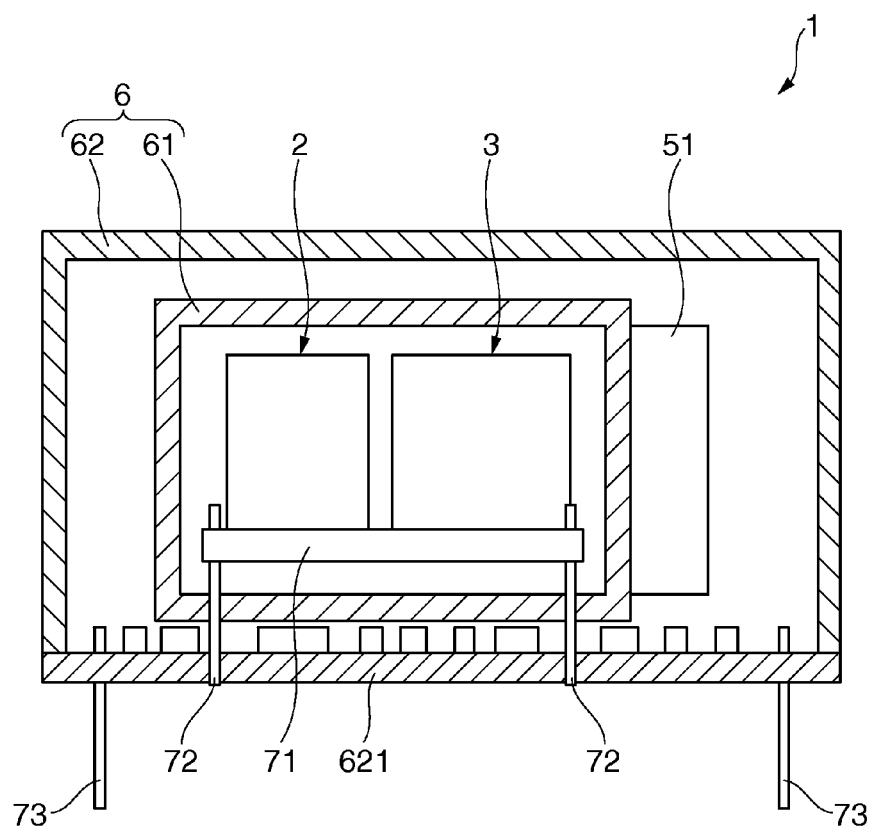
FIG. 2 is a sectional view showing a schematic configuration of the oscillating device shown in FIG. 1.
Figure 3:
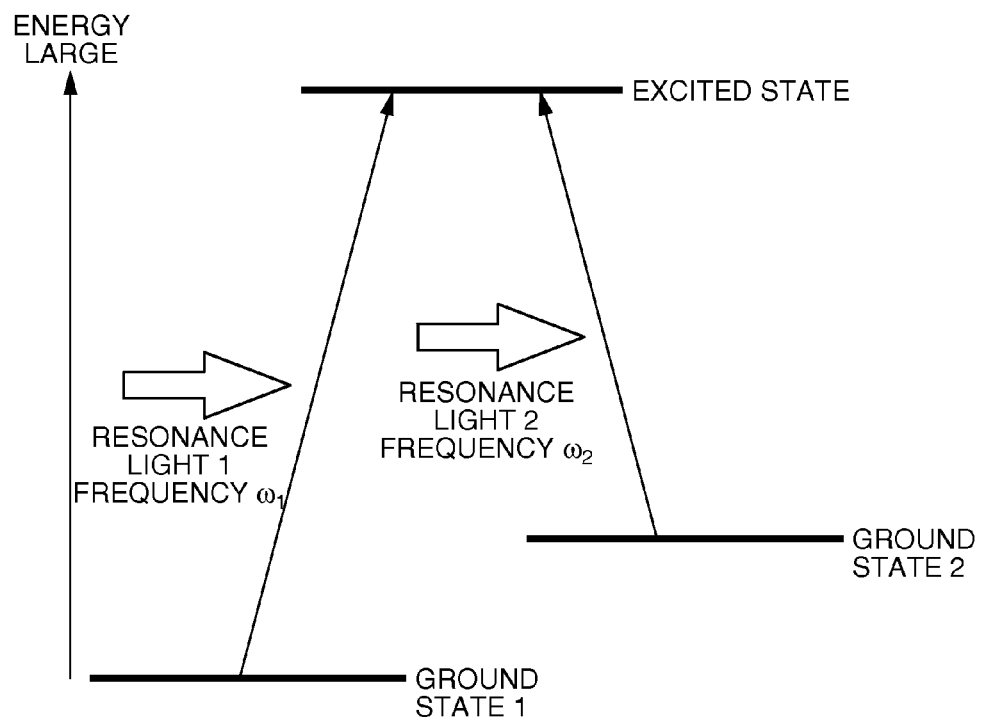
FIG. 3 is a diagram for explaining an energy state of alkali metal in a gas cell included in an atomic oscillator of the oscillating device shown in FIG. 1.
Figure 4:
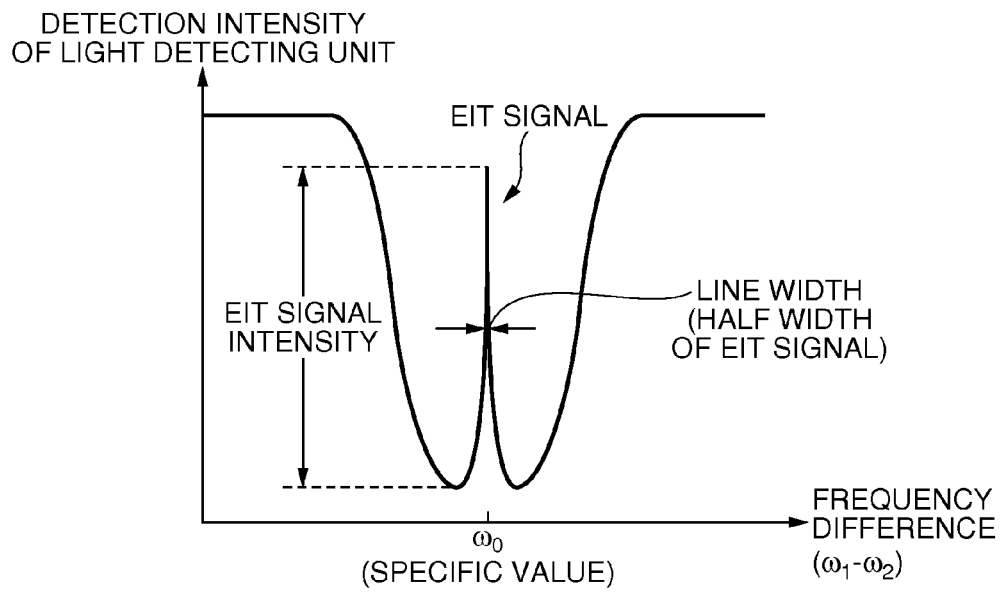
FIG. 4 is a graph showing, concerning a light emitting unit and a light detecting unit included in the atomic oscillator of the oscillating device shown in FIG. 1, a relation between a frequency difference of two lights from the light emitting unit and detection intensity of the light detecting unit.

FIG. 1 is a block diagram showing a schematic configuration of an oscillating device according to a first embodiment of the invention. FIG. 2 is a sectional view showing a schematic configuration of the oscillating device shown in FIG. 1. FIG. 3 is a diagram for explaining an energy state of alkali metal in a gas cell included in an atomic oscillator of the oscillating device shown in FIG. 1. FIG. 4 is a graph showing, concerning a light emitting unit and a light detecting unit included in the atomic oscillator of the oscillating device shown in FIG. 1, a relation between a frequency difference of two lights from the light emitting unit and detection intensity of the light detecting unit.

An oscillating device 1 shown in FIG. 1 includes an atomic oscillator 2, an oven controlled crystal oscillator 3, a correcting unit 4, and a temperature adjusting unit 5.

The oscillating device 1 includes, as shown in FIG. 2, a housing 6 configured to house the atomic oscillator 2 and the oven controlled crystal oscillator 3.

In the oscillating device 1, the atomic oscillator 2 and the oven controlled crystal oscillator 3 are subjected to temperature adjustment by the common temperature adjusting unit 5. Consequently, it is possible to realize a reduction in size and simplification of the oscillating device 1. Further, it is possible to prevent or reduce the influence of an external temperature change on the atomic oscillator 2 and the oven controlled crystal oscillator 3 and improve oscillation characteristics of the atomic oscillator 2 and the oven controlled crystal oscillator 3.

The correcting unit 4 corrects an output of the oven controlled crystal oscillator 3 on the basis of an output signal of the atomic oscillator 2. Consequently, it is possible to exhibit an excellent oscillation characteristic for a long term.

Configurations of the units of the oscillating device 1 are explained in detail below in order.

Atomic Oscillator

The atomic oscillator 2 is an atomic oscillator configured to oscillate making use of a quantum interference effect. The atomic oscillator that makes use of the quantum interference effect can be reduced in size compared with an atomic oscillator that makes use of a double resonance phenomenon.

The atomic oscillator 2 includes, as shown in FIG. 1, a gas cell 21, a light emitting unit 22, a light detecting unit 23, and an oscillating circuit 24. These units are housed in a package (not shown in the figure) included in the atomic oscillator 2.

The units of the atomic oscillator 2 are explained in detail below in order.

In the gas cell 21, gaseous alkali metal such as rubidium, cesium, or sodium is encapsulated.

As shown in FIG. 3, the alkali metal has energy levels of a three-level system. The alkali metal can take three states, i.e., two ground states (ground states 1 and 2) having different energy levels and an excited state. The ground state 1 is an energy state lower than the ground state 2.

When two kinds of resonance lights 1 and 2 having different frequencies are irradiated on such gaseous alkali metal, a light absorption ratio (light transmittance) of the resonance lights 1 and 2 in the alkali metal changes according to a difference ($\omega_1 - \omega_2$) between a frequency $\omega_1$ of the resonance light 1 and a frequency $\omega_2$ of the resonance light 2.

When the difference ($\omega_1 - \omega_2$) between the frequency) $\omega_1$ of the resonance light 1 and the frequency $\omega_2$ of the resonance light 2 coincides with a frequency equivalent to an energy difference between the ground state 1 and the ground state 2, excitations from the ground states 1 and 2 to the excited state are respectively stopped. At this point, both the resonance lights 1 and 2 are transmitted without being absorbed by the alkali metal. Such a phenomenon is referred to as CPT phenomenon or electromagnetically induced transparency (EIT) phenomenon.

For example, the frequency $\omega_1$ of the resonance light 1 is fixed and the frequency $\omega_2$ of the resonance light 2 is changed. Then, when the difference ($\omega_1 - \omega_2$) between the frequency $\omega_1$ of the resonance light 1 and the frequency $\omega_2$ of the resonance light 2 coincides with a frequency $\omega_0$ equivalent to the energy difference between the ground state 1 and the ground state 2, the intensity of the light transmitted through the gaseous alkali metal steeply rises as shown in FIG. 4. When such a steep change is detected as an EIT signal, the EIT signal has an eigenvalue determined by a type of the alkali metal. Therefore, it is possible to configure an oscillator by using such an EIT signal.

Although not shown in the figure, the gas cell 21 includes, for example, a main body section including a columnar through-hole and a pair of window sections that seals off both openings of the through-hole. Consequently, an internal space in which the alkali metal is encapsulated is formed.

A material forming the main body section is not specifically limited and may be a metal material, a resin material, or the like or may be a glass material, crystal, or the like same as a material of the window section. The material forming the window section is not specifically limited as long as the material has transparency to excitation lights. Examples of the material include a glass material, crystal, and the like.

The gas cell 21 is heated by a heater (not shown in the figure) subjected to energization control on the basis of a detection result of a temperature sensor that detects the temperature of the gas cell 21. Consequently, it is possible to maintain the alkali metal in the gas cell 21 in a gaseous state.

A magnetic field is applied to the gas cell 21 from a coil by energization according to necessity. Consequently, it is possible to expand a gap between degenerated different energy states of the alkali metal in the gas cell 21 and improve resolution. As a result, it is possible to improve the accuracy of an oscillation frequency of the atomic oscillator 2.

The light emitting unit 22 has a function of emitting excitation lights for exciting alkali metal atoms in the gas cell 21.

More specifically, the light emitting unit 22 emits the two kinds of lights (the resonance light 1 and the resonance light 2) having different frequencies to the gas cell 21.

The frequency $\omega 1$ of the resonance light 1 can excite the alkali metal in the gas cell 21 from the ground state 1 to the excited state.

The frequency $\omega 2$ of the resonance light 2 can excite the alkali metal in the gas cell 21 from the ground state 2 to the excited state.

The light emitting unit 22 is not specifically limited as long as the light emitting unit 22 can emit the excitation lights. For example, a semiconductor laser such as a vertical cavity surface emitting laser (VCSEL) can be used.

Optical elements such as a lens, a neutral density filter, a $\lambda/4$ wavelength plate, and a sheet polarizer are provided between the light emitting unit 22 and the gas cell 21 according to necessity. Consequently, it is possible to adjust intensity, a spot diameter, polarization, and the like of the excitation lights irradiated on the gas cell 21.

The light detecting unit 23 has a function of detecting the intensity of the excitation lights (the resonance lights 1 and 2) transmitted through the internal space of the gas cell 21.

Specifically, the light detecting unit 23 detects presence or absence of the EIT signal explained above.

A not-shown circuit controls the driving of the light emitting unit 22 on the basis of a detection result of the light detecting unit 23. Consequently, it is possible to maintain a state in which the light emitting unit 22 emits the resonance lights 1 and 2 as explained above.

The light detecting unit 23 is not specifically limited as long as the light detecting unit 23 can detect the excitation lights. For example, a photodetector (a light receiving element) such as a solar cell or a photodiode can be used.

The oscillating circuit 24 oscillates on the basis of the frequency of a not-shown crystal oscillator (separate from a crystal resonator 31 of the oven controlled crystal oscillator 3).

An oscillation frequency of the oscillating circuit 24 is variable. The oscillation frequency is corrected on the basis of the EIT signal detected by the light detecting unit 23. For example, the oscillating circuit 24 configures a voltage controlled crystal oscillator in a state in which the oscillating circuit 24 is combined with the crystal resonator.

Oven Controlled Crystal Oscillator (OCXO)

The oven controlled crystal oscillator 3 (an oven controlled oscillator) includes, as shown in FIG. 1, the crystal resonator 31 and an oscillating circuit 32.

The oven controlled crystal oscillator 3 is configured to adjust the temperature of the crystal resonator 31 to a predetermined temperature. Specifically, at least the crystal resonator 31 is provided in a thermostatic oven (not shown in the figure) included in the oven controlled crystal oscillator 3. The temperature on the inside of the thermostatic oven is adjusted to a predetermined temperature. The thermostatic oven may be configured by one wall or may be configured by two (double) walls (a double oven).

The crystal resonator 31 is not specifically limited. Various crystal resonators can be used as the crystal resonator 31. For example, an AT cut resonator and an ST cut resonator can be used.

The oscillating circuit 32 oscillates on the basis of the frequency of the crystal resonator 31.

An oscillation frequency of the oscillating circuit 32 is variable. The oscillation frequency is corrected by a correcting unit 4 explained below on the basis of the output signal of the atomic oscillator 2. For example, the oven controlled crystal oscillator 3 configures a voltage controlled crystal oscillator.

Correcting Unit

The correcting unit 4 corrects the output signal (the oscillation frequency) of the oven controlled crystal oscillator 3 on the basis of the output signal (the oscillation frequency) of the atomic oscillator 2. Consequently, it is possible to exhibit an excellent oscillation characteristic for a long term.

The correcting unit 4 includes, as shown in FIG. 1, a frequency comparator 41 and a frequency control circuit 42.

The frequency comparator 41 compares the output signal (the oscillation frequency) of the atomic oscillator 2 and the output signal (the oscillation frequency) of the oven controlled crystal oscillator 3 and outputs, as a comparison result, a voltage corresponding to a difference between the output signals (the oscillation frequencies) or presence or absence of the difference.

The frequency control circuit 42 controls the output signal (the oscillation frequency) of the oven controlled crystal oscillator 3 on the basis of the comparison result of the frequency comparator 41. Specifically, the frequency control circuit 42 controls, on the basis of the comparison result of the frequency comparator 41, the oscillation frequency of the oven controlled crystal oscillator 3 to coincide with the oscillation frequency of the atomic oscillator 2.

Housing

The housing 6 houses the atomic oscillator 2 and the oven controlled crystal oscillator 3 as shown in FIG. 2. Since the atomic oscillator 2 and the oven controlled crystal oscillator 3 are housed in the common housing 6, it is possible to subject the atomic oscillator 2 and the oven controlled crystal oscillator 3 to temperature adjustment with the common temperature adjusting unit. It is possible to perform efficient heat exchange between the atomic oscillator 2 and the oven controlled crystal oscillator 3. It is possible to efficiently perform the temperature adjustment for the atomic oscillator 2 and the oven controlled crystal oscillator 3. Compared with housing the atomic oscillator 2 and the oven controlled crystal oscillator 3 in separate housings, it is possible to realize a reduction in size and simplification of the oscillating device 1.

In this embodiment, the housing 6 includes an inner layer 61 (a first housing) and an outer layer 62 (a second housing) that houses the inner layer 61. Consequently, a space between the inner layer 61 and the outer layer 62 of the housing 6 forms a heat insulating layer. The heat insulating layer covers the atomic oscillator 2 and the oven controlled crystal oscillator 3. Therefore, it is possible to reduce the influence of an external temperature change on the inside of the housing 6.

The inner layer 61 has a space in which the atomic oscillator 2 and the oven controlled crystal oscillator 3 are housed.

In this embodiment, in the inner layer 61, a circuit board 71 (a wiring board) is housed together with the atomic oscillator 2 and the oven controlled crystal oscillator 3. The circuit board 71 supports the atomic oscillator 2 and the oven controlled crystal oscillator 3. The circuit board 71 is electrically connected to the atomic oscillator 2 and the oven controlled crystal oscillator 3.

The circuit board 71 is supported in the inner layer 61 via a plurality of terminals 72.

The plurality of terminals 72 pierce the inner layer 61 from the inside to the outside. The plurality of terminals 72 electrically connects the circuit board 71 and a circuit board 621 explained below.

One ends of the plurality of terminals 72 are fixed to the circuit board 71 and the other ends are fixed to the outer layer 62 (the circuit board 621). Consequently, the inner layer 61 is supported in the outer layer 62 via the plurality of terminals 72. Therefore, it is possible to form the space between the inner layer 61 and the outer layer 62 to cover the entire inner layer 61.

The outer layer 62 has a space in which the inner layer 61 is housed.

In this embodiment, a part of a wall section of the outer layer 62 forms the circuit board 621. On the circuit board 621, the frequency comparator 41 and the frequency control circuit 42 of the correcting unit 4, a temperature control circuit 52 of the temperature adjusting unit 5 explained below, and the like are provided.

On the circuit board 621, a plurality of terminals 73 are provided to project to the outer side of the outer layer 62. The plurality of terminals 73 are electrically connected to the circuit board 621.

The space between the inner layer 61 and the outer layer 62 on the outer side of the inner layer 61 is desirably decompressed. That is, the heat insulating layer of the space between the inner layer 61 and the outer layer 62 of the housing 6 is desirably formed in the decompressed space. Consequently, it is possible to improve thermal insulation properties of the heat insulating layer and more effectively reduce the influence of the external temperature change on the inside of the housing 6.

In this embodiment, it is desirable that gas such as the air, a nitrogen gas, or a rare gas is encapsulated in the inner layer 61 (the space of the housing 6 in which the atomic oscillator 2 and the oven controlled crystal oscillator 3 are housed). Consequently, it is possible to subject the atomic oscillator 2 and the oven controlled crystal oscillator 3 to temperature adjustment with a temperature adjusting element 51 explained below.

Temperature Adjusting Unit

The temperature adjusting unit 5 adjusts the temperature in the housing 6 to a predetermined temperature.

The temperature adjusting unit 5 includes, as shown in FIG. 1, the temperature adjusting element 51 and the temperature control circuit 52.

The temperature adjusting element 51 heats or cools the housing 6. Consequently, even if the temperature on the outside (the outside of the housing 6) changes, it is possible to maintain the temperature in the housing 6 in a proper temperature range.

The temperature adjusting element 51 is not specifically limited as long as the temperature adjusting element 51 can be heated or cooled by energization. A heater (a heat generating resistor), a Peltier element, and the like can be used.

In this embodiment, the temperature adjusting element 51 is provided between the inner layer 61 and the outer layer 62 of the housing 6. Consequently, it is possible to uniformly adjust the temperature in the housing 6 (specifically, in the inner layer 61) with a relatively simple configuration.

The temperature control circuit 52 controls the energization to the temperature adjusting element 51 to set the temperature in the housing 6 in a desired temperature range. For example, the temperature control circuit 52 controls the energization to the temperature adjusting element 51 on the basis of a detection result of a temperature sensor that detects the temperature in the housing 6. Consequently, it is possible to maintain the temperature in the housing 6 in the desired temperature range.

The temperature control circuit 52 is provided on the inner side of the circuit board 621. That is, the temperature control circuit 52 is provided between the inner layer 61 and the outer layer 62. Consequently, it is possible to reduce the influence of the external temperature change on the temperature control circuit 52. As a result, it is possible to more effectively reduce the influence of the external temperature change on the inside of the housing 6. Further, it is possible to reduce the influence of heat exchange between the temperature control circuit 52 and the atomic oscillator 2 and oven controlled crystal oscillator 3.

With the oscillating device 1 according to this embodiment explained above, it is possible to subject the atomic oscillator 2 and the oven controlled crystal oscillator 3 to temperature adjustment with the common temperature adjusting unit 5. As a result, it is possible to realize a reduction in size and simplification of the oscillating device 1. Further, it is possible to prevent or reduce the influence of the external temperature change on the atomic oscillator 2 and the oven controlled crystal oscillator 3 and improve the oscillation characteristics of the atomic oscillator 2 and the oven controlled crystal oscillator 3.

It is possible to exhibit an excellent oscillation characteristic for a long term by correcting an output of the oven controlled crystal oscillator 3 on the basis of an output signal of the atomic oscillator 2.

That is, it is possible to exhibit an excellent oscillation characteristic for a long term making the most of both advantages of an oscillation characteristic of the atomic oscillator 2 excellent for a long term (high long-term stability) and an oscillation characteristic of the oven controlled oscillator 3 excellent for a short term (high short-term stability). The atomic oscillator 2 that makes use of the quantum interference effect can be reduced in size compared with an atomic oscillator that makes use of a double resonance phenomenon. Therefore, it is possible to realize a reduction in size of the oscillating device 1.

Second Embodiment

A second embodiment of the invention is explained.

Figure 5:
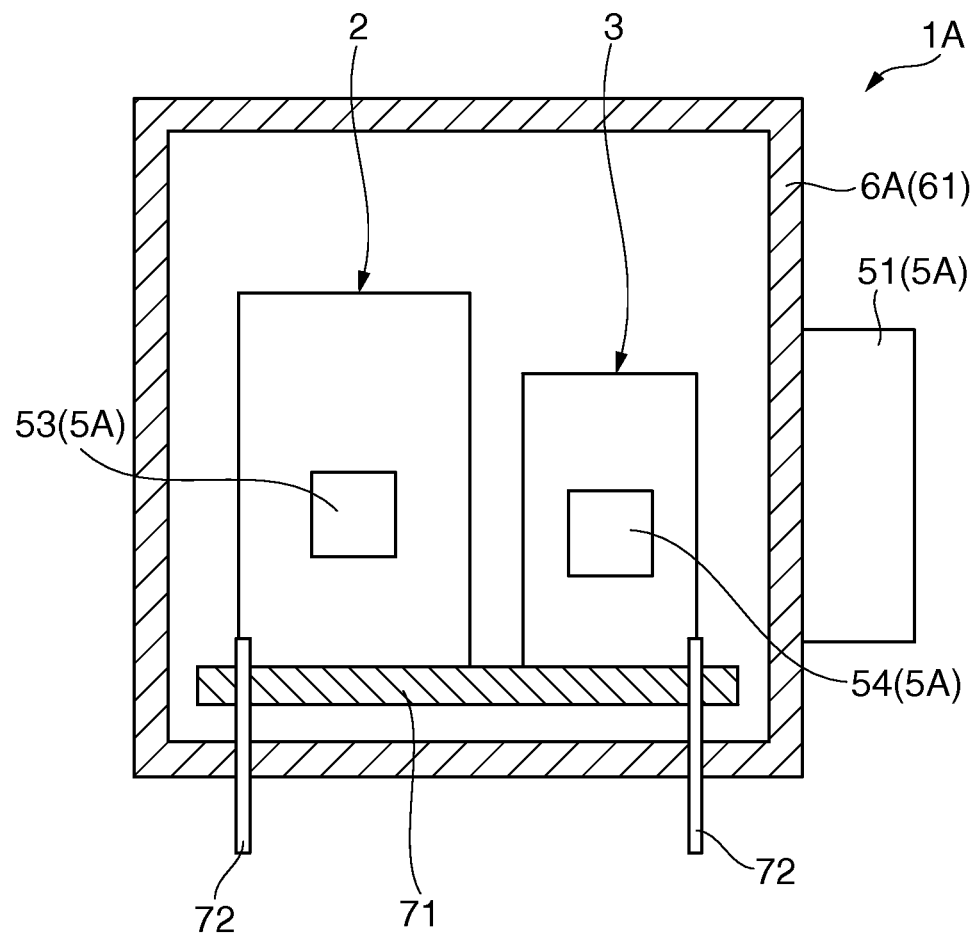
FIG. 5 is a sectional view showing a schematic configuration of an oscillating device according to a second embodiment of the invention.

FIG. 5 is a sectional view showing a schematic configuration of an oscillating device according to the second embodiment of the invention.

The oscillating device according to this embodiment is the same as the oscillating device according to the first embodiment except that the configurations of a housing and a temperature adjusting unit are different.

In the following explanation, concerning the oscillating device according to the second embodiment, differences from the first embodiment are mainly explained. Explanation of similarities is omitted. In FIG. 5, components same as the components explained in the first embodiment are denoted by the same reference numerals and signs.

An oscillating device 1A shown in FIG. 5 includes a housing 6A configured to house the atomic oscillator 2 and the oven controlled crystal oscillator 3 and a temperature adjusting unit 5A configured to adjust the temperature in the housing 6A to a predetermined temperature.

The housing 6A is configured the same as the inner layer 61 of the housing 6 in the first embodiment.

The temperature adjusting unit 5A includes the temperature adjusting element 51 provided on the outer surface of the housing 6A, a temperature adjusting element 53 provided on the outer surface of the atomic oscillator 2, and a temperature adjusting element 54 provided on the outer surface of the oven controlled crystal oscillator 3.

The temperature adjusting element 53 heats or cools the atomic oscillator 2. Consequently, it is possible to efficiently subject the atomic oscillator 2 to temperature adjustment.

The temperature adjusting element 54 heats or cools the oven controlled crystal oscillator 3. Consequently, it is possible to efficiently subject the oven controlled crystal oscillator 3 to temperature adjustment.

The temperature adjusting elements 53 and 54 are not specifically limited as long as the temperature adjusting elements 53 and 54 can be heated or cooled by energization. A heater (a heat generating resistor), a Peltier element, and the like can be used.

The temperature adjusting elements 51, 53, and 54 are subjected to energization control by a not-shown temperature control circuit.

In this embodiment, a space of the housing 6A in which the atomic oscillator 2 and the oven controlled crystal oscillator 3 are housed is desirably decompressed. Consequently, it is possible to improve heat insulation properties of a heat insulating layer formed by the space that covers the atomic oscillator 2 and the oven controlled crystal oscillator 3 in the housing 6A. Therefore, it is possible to more effectively reduce the influence of an external temperature change on the inside of the housing 6A.

With the oscillating device 1A according to the second embodiment explained above, as in the first embodiment, it is possible to exhibit an excellent oscillation characteristic for a long term and realize a reduction in size and simplification.

Figure 6:
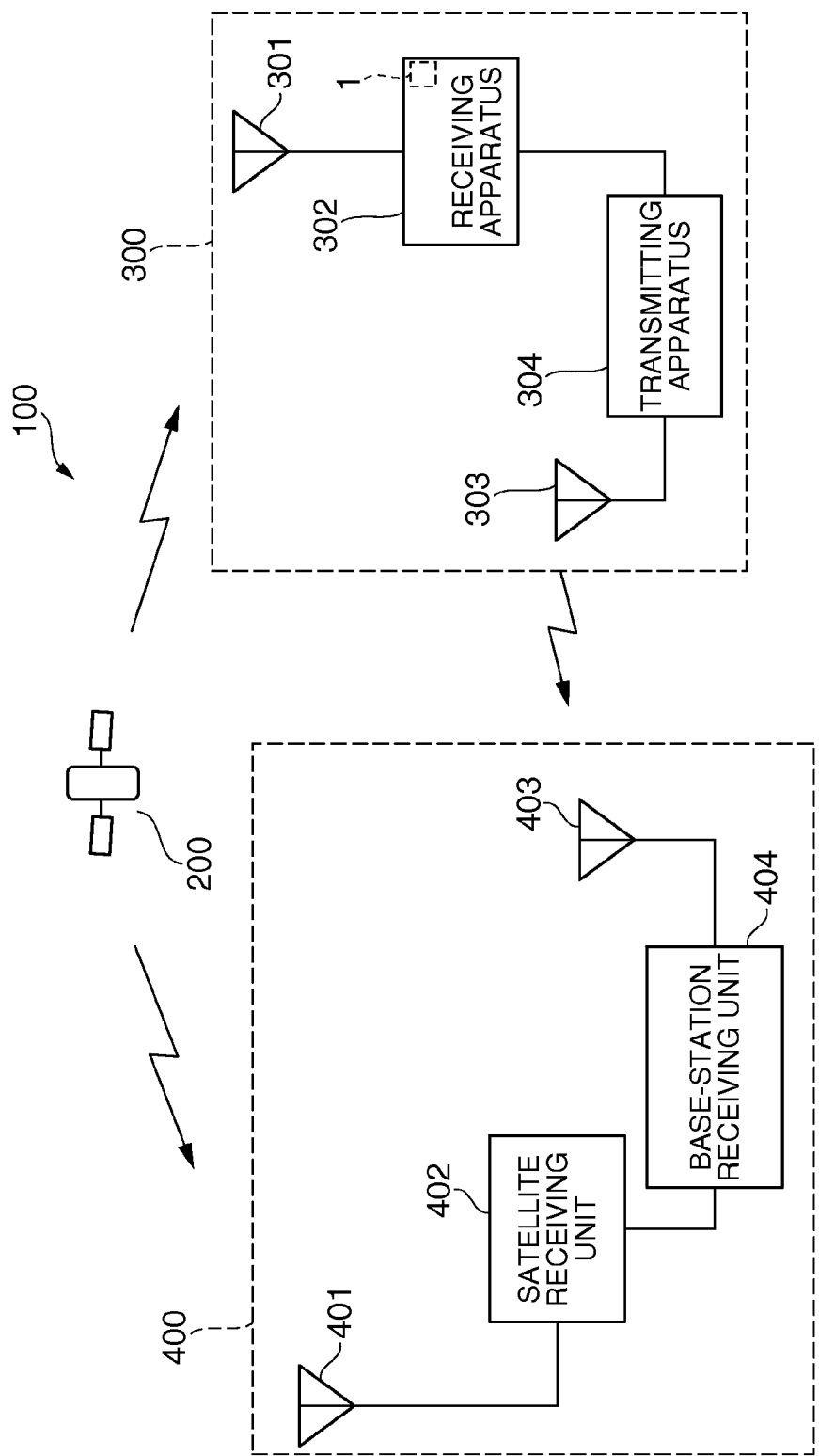
FIG. 6 is a schematic diagram of a system configuration in which the oscillating device according to the first embodiment is used for a positioning system that makes use of a GPS satellite.

FIG. 6 is a schematic diagram of a system configuration in which the oscillating device 1 according to the first embodiment is used for a positioning system that makes use of a GPS satellite.

A positioning system 100 shown in FIG. 6 includes a GPS satellite 200, a base station apparatus 300, and a GPS receiving apparatus 400. The GPS satellite 200 transmits positioning information (a GPS signal).

The base station apparatus 300 includes a receiving apparatus 302 configured to highly accurately receive positioning information from the GPS satellite 200 via an antenna 301 set, for example, in a permanent GPS monument (a GPS continuous observation station) and a transmitting apparatus 304 configured to transmit, via an antenna 303, the positioning information received by the receiving apparatus 302.

The receiving apparatus 302 is an electronic apparatus including, as a reference frequency oscillation source, the oscillating device 1 according to the first embodiment. The receiving apparatus 302 has excellent reliability. The positioning information received by the receiving apparatus 302 is transmitted by the transmitting apparatus 304 on a real time basis. The GPS receiving apparatus 400 includes a satellite receiving unit 402 configured to receive the positioning information from the GPS satellite 200 via an antenna 401 and a base-station receiving unit 404 configured to receive the positioning information from the base station apparatus 300 via an antenna 403.

The oscillating devices and the electronic apparatus according to the embodiments of the invention are explained above with reference to the drawings. However, the invention is not limited to the oscillating devices and the electronic apparatus.

In the oscillating devices and the electronic apparatus according to the embodiments, the units can be replaced with units having arbitrary configurations that display the same functions. Arbitrary configurations can be added.

In the oscillating devices and the electronic apparatus, arbitrary configurations of the embodiments may be combined.

The entire disclosure of Japanese Patent Application No. 2012-107792, filed May 9, 2012 is expressly incorporated by reference herein.

What is claimed is:

1. An oscillating device comprising:
   an atomic oscillator;
   an oven controlled oscillator;
   a correcting unit configured to correct an output signal of the oven controlled oscillator on the basis of an output signal of the atomic oscillator;
   a housing configured to house the atomic oscillator and the oven controlled oscillator; and
   a temperature adjusting unit configured to adjust temperature in the housing to a predetermined temperature.

2. The oscillating device according to claim 1, wherein the temperature adjusting unit includes a temperature adjusting element configured to heat or cool the housing.

3. The oscillating device according to claim 1, wherein the housing includes a first housing and a second housing configured to house the first housing.

4. The oscillating device according to claim 3, wherein the temperature adjusting element is provided between the first housing and the second housing.

5. The oscillating device according to claim 3, wherein
   the temperature adjusting unit includes a temperature control circuit configured to control a temperature adjusting element that heats or cools the housing, and
   the temperature control circuit is provided between the first housing and the second housing.

6. The oscillating device according to claim 1, further comprising a heat insulating layer configured to cover the atomic oscillator and the oven controlled oscillator.

7. The oscillating device according to claim 6, further comprising a heat insulating layer configured to cover the atomic oscillator and the oven controlled oscillator and formed by a decompressed space.

8. The oscillating device according to claim 1, wherein
   the atomic oscillator includes a gas cell in which gaseous atoms are encapsulated, a light emitting unit configured to emit excitation light for exciting the atoms, and a light detecting unit configured to detect the excitation light transmitted through the gas cell and is configured to oscillate making use of a quantum interference effect, and
   the oven controlled oscillator includes a crystal resonator and is configured to adjust temperature of the crystal resonator to a predetermined temperature.

9. An electronic apparatus comprising an oscillating device including an atomic oscillator, an oven controlled oscillator, a correcting unit configured to correct an output signal of the oven controlled oscillator on the basis of an output signal of the atomic oscillator, a housing configured to house the atomic oscillator and the oven controlled oscillator, and a temperature adjusting unit configured to adjust temperature in the housing to a predetermined temperature.

* * * * *